United States Patent
Kwon et al.

(10) Patent No.: US 8,687,458 B2
(45) Date of Patent: Apr. 1, 2014

(54) SEMICONDUCTOR APPARATUS FOR REDUCING CROSS TALK AND SEMICONDUCTOR SYSTEM USING THE SAME

(75) Inventors: Dae Han Kwon, Icheon-si (KR); Chang Kyu Choi, Icehon-si (KR); Jun Woo Lee, Icheon-si (KR); Taek Sang Song, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 343 days.

(21) Appl. No.: 13/168,071

(22) Filed: Jun. 24, 2011

(65) Prior Publication Data
US 2012/0195153 A1    Aug. 2, 2012

(30) Foreign Application Priority Data

Jan. 31, 2011    (KR) .................. 10-2011-0009803

(51) Int. Cl.
*G11C 8/18*    (2006.01)
(52) U.S. Cl.
USPC .............. 365/233.11; 365/189.05; 365/233.1; 365/230.08
(58) Field of Classification Search
USPC .............. 365/189.05, 230.08, 233.01, 233.11
See application file for complete search history.

(56) References Cited

U.S. PATENT DOCUMENTS

2009/0154256 A1*   6/2009   Kim et al. ................ 365/189.05
2011/0235459 A1*   9/2011   Ware et al. ............... 365/233.11

FOREIGN PATENT DOCUMENTS

| KR | 1020030094678 A | 12/2003 |
| KR | 100524944 B1 | 10/2005 |
| KR | 1020090070413 A | 7/2009 |

* cited by examiner

*Primary Examiner* — Thao Bui
(74) *Attorney, Agent, or Firm* — William Park & Associates Patent Ltd.

(57) ABSTRACT

A semiconductor apparatus includes an odd data clock buffer group configured to maintain or shift a phase of a multi-phase source clock signal, and output a first multi-phase clock signal, an even data clock buffer group configured to maintain or shift a phase of the multi-phase source clock signal, and output a second multi-phase clock signal, an odd data output buffer group configured to drive odd data in response to the first multi-phase clock signal and output the driven data to an odd data pad group, and an even data output buffer group configured to drive even data in response to the second multi-phase clock signal and output the driven data to an even data pad group, wherein the phases of clock signals of the first and second multi-phase clock signal are different from each other.

12 Claims, 4 Drawing Sheets

SEMICONDUCTOR APPARATUS FOR REDUCING CROSS TALK AND SEMICONDUCTOR SYSTEM USING THE SAME

CROSS-REFERENCES TO RELATED APPLICATION

The present application claims priority under 35 U.S.C. §119(a) to Korean application number 10-2011-0009803, filed on Jan. 31, 2011, in the Korean Intellectual Property Office, which is incorporated herein by reference in its entirety as set forth in full.

BACKGROUND

1. Technical Field

The present invention relates to a semiconductor system, and more particularly, to a semiconductor system including a transmission circuit.

2. Related Art

In general, a semiconductor memory apparatus includes a plurality of data pads to communicate with controllers such as a central processing unit (CPU) and a graphic processor unit (GPU), which are configured to control the semiconductor memory apparatus.

Furthermore, the semiconductor memory apparatus may generate a multi-phase clock signal having multiple phases for an external clock signal, in order to more quickly output data. The semiconductor memory apparatus may achieve high-speed data output by outputting data to the data pads according to the multi-phase clock signal.

The controllers configured to control the semiconductor memory apparatus may receive data, which is outputted from the data pads, in synchronization with a data strobe signal.

With the integration of semiconductor memory apparatuses, a physical distance between the plurality of data pads is gradually decreasing. Accordingly, severe crosstalk may occur between the plurality of data pads or between transmission lines for transmitting data from/to the data pads.

Furthermore, such crosstalk may occur even in channels of controllers communicating with a semiconductor memory apparatus. As the physical distance between data pads of the semiconductor memory apparatus decreases, a distance between the channels of the controllers is also decreasing.

Such crosstalk may be influenced by transition patterns of logic value of data applied to adjacent data pads and transmission lines. More specifically, if logic values of the data applied to the adjacent data pads and the adjacent transmission lines transit at the same time, the crosstalk may increase, and thus data reliability may deteriorate.

SUMMARY

In an exemplary embodiment of the present invention, a semiconductor apparatus includes an odd data clock buffer group configured to maintain or shift a phase of a multi-phase source clock signal, and output a first multi-phase clock signal, an even data clock buffer group configured to maintain or shift a phase of the multi-phase source clock signal, and output a second multi-phase clock signal, an odd data output buffer group configured to drive odd data in response to the first multi-phase clock signal, and output the driven data to an odd data pad group, and an even data output buffer group configured to drive even data in response to the second multi-phase clock signal, and output the driven data to an even data pad group, wherein the phases of clock signals of the first and second multi-phase clock signal are different from each other.

In another exemplary embodiment of the present invention, a semiconductor apparatus includes an odd data clock buffer configured to maintain or shift a phase of a source clock signal, and output a first clock signal, an even data clock buffer group configured to maintain or shift the phase of the source clock signal, and output a second clock signal, an odd data output buffer configured to output data in response to the first clock signal, and an even data output buffer configured to output data in response to the second clock signal, wherein the phases of the first clock signal and the second clock signal are different from each other.

In another exemplary embodiment of the present invention, a semiconductor system includes a transmission unit and a reception unit. Here, the transmission unit is configured to output odd data to an odd data pad group in response to a first multi-phase clock signal and output even data to an even data pad group in response to a second multi-phase clock signal, wherein the phases of clock signals of the first and second multi-phase clock signal are different from each other.

BRIEF DESCRIPTION OF THE DRAWINGS

Features, aspects, and embodiments are described in conjunction with the attached drawings, in which.

DETAILED DESCRIPTION

Hereinafter, a semiconductor system and a semiconductor apparatus according to the present invention will be described below with reference to the accompanying drawings through exemplary embodiments.

A semiconductor system according to an exemplary embodiment includes a transmission unit and a reception unit. The semiconductor system may control transition points of logic value of data applied to a data pad, thereby reducing/minimizing crosstalk occurring in adjacent data pads or transmission lines.

Furthermore, in channels for communication between the transmission unit and the reception unit, crosstalk of the channels may decrease by controlling transition points of logic value of data applied to adjacent channels.

For reference, the reception unit may perform a training operation for normally recognizing data received from the respective data pads without any problems even though the data have different transition points of logic value.

For reference, in the semiconductor system, the transmission unit may be arranged in a semiconductor memory apparatus, and the reception unit may be arranged in a controller for controlling the semiconductor memory apparatus. However, the positions of the transmission unit and the reception unit are not limited to specific positions, and thus the transmission unit may be arranged in the controller, and the reception unit may be arranged in the semiconductor memory apparatus.

Figure 1:
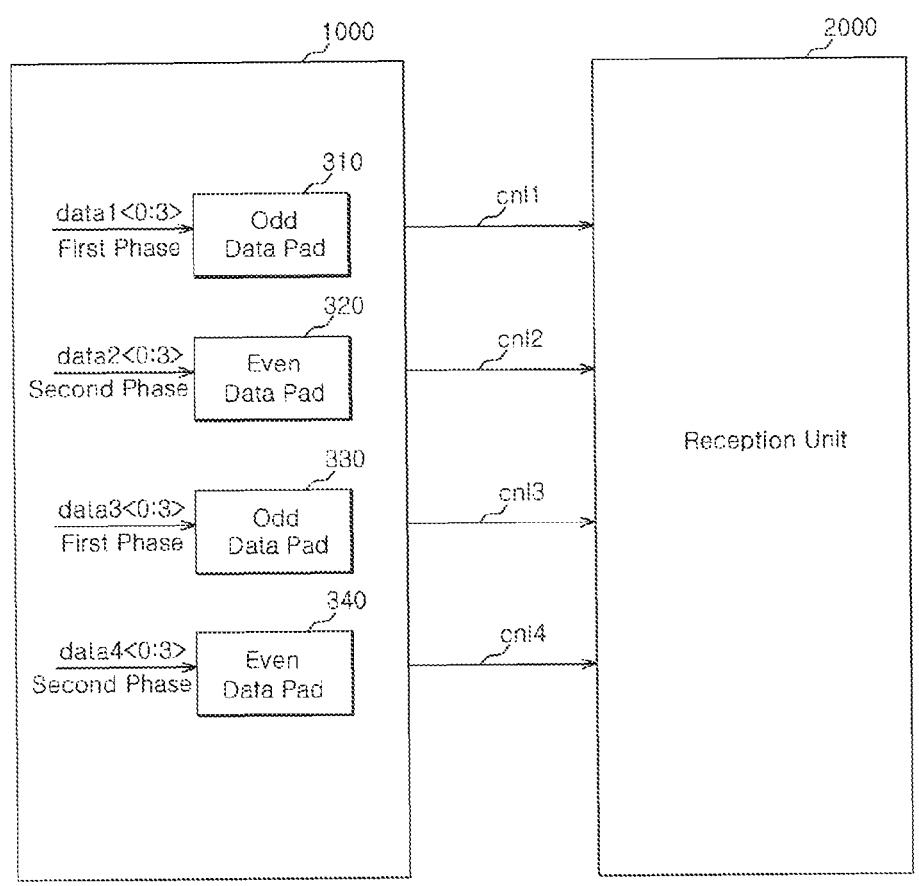
FIG. 1 is a simple block diagram of a semiconductor system according to an exemplary embodiment.

FIG. 1 is a simple block diagram of a semiconductor system according to an exemplary embodiment.

The semiconductor system may include a transmission unit 1000 and a reception unit 2000. The reception unit may be configured to output odd data to an odd data pad group in response to a first multi-phase clock signal, and output even data to an even data pad group in response to a second multi-phase clock signal.

The transmission unit 1000 is configured to output odd data data1<0:3> and data3<0:3> to an odd data pad group 310 and 330 in response to the first multi-phase clock signal, and output even data data2<0:3> and data4<0:3> to an even data pad group 320 and 340 in response to the second multi-phase clock signal.

The odd data data1<0:3> and data3<0:3> and the even data data2<0:3> and data4<0:3> have a data form which is used for high-speed data transmission, such as Double Data Rate (DDR). For example, in the above-described semiconductor system, the odd data data1<0:3> and data3<0:3> are processed in synchronization with a rising edge of a clock signal, and the even data data2<0:3> and data4<0:3> are processed in synchronization with a falling edge of the clock signal.

The semiconductor system includes channels cnl1 and cnl3 for communication between the reception unit 2000 and the odd data pad group 310 and 330, and channels cnl2 and cnl4 for communication between the reception unit 2000 and the even data pad group 320 and 340. The channels cnl1 and cnl3 and the channels cnl2 and cnl4 may be alternately arranged.

The reception unit 2000 is coupled to the channels cnl1 to cnl4, and communicates with the odd and even data pad groups 310 to 340. The reception unit 2000 receives the odd data data1<0:3> and data3<0:3> and the even data data2<0:3> and data4<0:3> from the odd data pad group 310 and 330 and the even data pad group 320 and 340.

The reception unit 2000 may perform a training operation on the odd and even data data1<0:3> to data4<0:3> received from the odd and even data pad groups 310 to 340. The training operation may include an operation of testing a certain training pattern for the odd and even data pad groups 310 to 340 and an operation of searching for optimal timings for recognizing the data applied to the respective data pads 310 to 340 according to the test result.

In order to perform the training operation, the reception unit 2000 may require receiving a certain timing signal. Here, the timing signal does not need to be limited to a specific signal. For example, the reception unit 2000 may perform the training operation by using a data strobe signal (not shown). However, a method of inputting and outputting data without using the data strobe signal may be used. For example, the reception unit 2000 and the is transmission unit 1000 may use two kinds of clock signals having different purposes to perform a data input/output operation. In this case, the reception unit 2000 may perform the training operation through at least one of the two clock signals.

As the reception unit 2000 performs the training operation, the reception unit 2000 may receive data from the even and odd data pad groups 310 to 340 having different transition points of logic value, without any problems.

Figure 2:
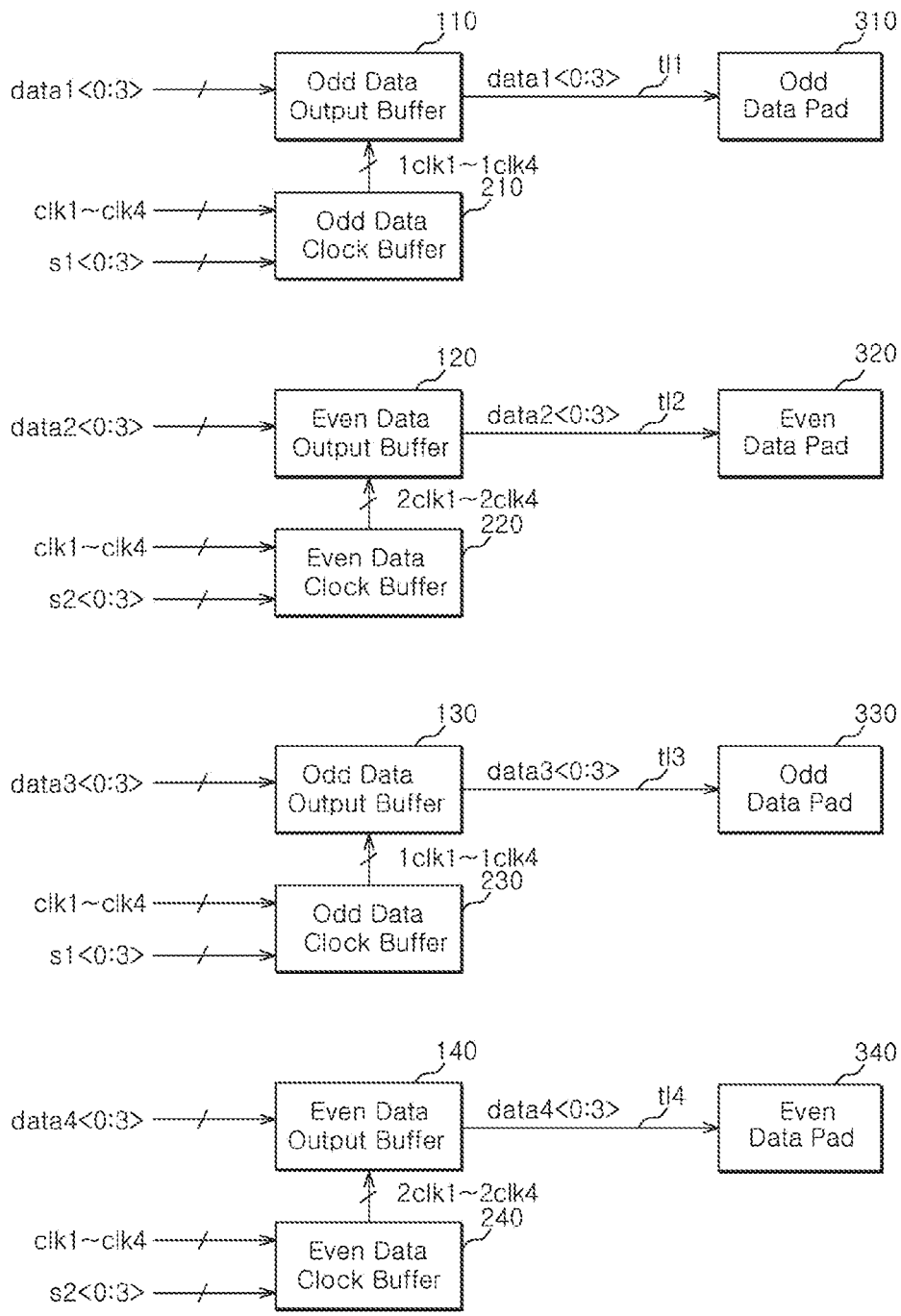
FIG. 2 is a simple block diagram of a transmission unit illustrated in FIG. 1.

FIG. 2 is a simple block diagram of the transmission unit 1000 illustrated in FIG. 1.

The transmission unit 1000 illustrated in FIG. 2 may include multi-phase clock generation sections 210 to 240, an odd data output buffer group 110 and 130, the odd data pad group 310 and 330, an even data output buffer group 120 and 140, and the even data pad group 320 and 340.

The multi-phase clock generation sections 210 to 240 are configured to interpolate a third multi-phase clock signal clk1 to clk4 and generate a first multi-phase clock signal 1clk1 to 1clk4 and a second multi-phase clock signal 2clk1 to 2clk4. The multi-phase clock generation sections 210 to 240 are positioned in the transmission unit 1000.

The multi-phase clock generation units 210 to 240 may include an odd data clock buffer group 210 and 230 and an even data clock buffer group 220 and 240. Here, the odd data clock buffer group 210 and 230 is configured to buffer the third multi-phase clock signal clk1 to clk4 and generate the first multi-phase clock signal 1clk1 to 1clk4, and the even data clock buffer group 220 and 240 is configured to buffer the third multi-phase clock signal clk1 to clk4 and generate the second multi-phase clock signal 2clk2 to 2clk4.

The odd data output buffer group 110 and 130 is configured to output the odd data data1<0:3> and data3<0:3> to the odd data pad group 310 and 330 in response to the first multi-phase clock signal 1clk1 to 1clk4. The odd data output buffer group 110 and 130 and the odd data pad group 310 and 330 are coupled through an odd transmission line group tl1 and tl3.

For example, when the first multi-phase clock signal 1clk1 to 1clk4 is activated at 0, 90, 180, and 270 degrees, respectively, the odd data output buffer 110 sequentially outputs the respective bits of the odd data data1<0:3> at 0, 90, 180, and 270 degrees.

The even data output buffer group 120 and 130 is configured to output the even data data2<0:3> and data4<0:3> to the even data pad group 320 and 340 in response to the second multi-phase clock signal 2clk1 to 2clk4. The even data output buffer group 120 and 140 and the even data pad group 320 and 340 are coupled through an even transmission line group tl2 and tl4.

The odd and even data output buffer groups 110 to 140 may include general buffer circuits configured to output the odd and even data data1<0:3> to data4<0:3> in response to the first and second multi-phase clock signals 1clk1 to 1clk4 and 2clk1 to 2clk4 respectively.

The semiconductor system configured in the above-described manner may set the phases of the first multi-phase clock signal 1clk1 to 1clk4, which is used to decide data output time points of the odd data output buffer group 110 and 130, differently from those of the second multi-phase clock signal 2clk1 to 2clk4, which is used to decide data output time points of the even data output buffer group 120 and 140. Accordingly, the semiconductor system may reduce a crosstalk effect between the odd transmission line group tl1 and tl3 and the even transmission line group tl2 and tl4. Here, the odd transmission line group tl1 and tl3 are used for coupling the odd data output buffer group 110 and 130 to the odd data pad group 310 and 330, and the even transmission line group tl2 and tl4 are used for coupling the even data output buffer group 120 and 140 to the even data pad group 320 and 340.

As illustrated in FIG. 1, the channels cnl1 and cnl3 for communication between the reception unit 2000 and the odd data pad group 310 and 330 and the channels cnl2 and cnl4 for communication between the reception unit 2000 and the even data pad group 320 and 340 may be alternately arranged, and it is effective to reduce the crosstalk effect.

As illustrated in FIG. 2, the odd transmission line group tl1 and tl3 including the odd data pad group 310 and 330 and the even transmission line group tl2 and tl4 including the even data pad group 320 and 340 may be alternately arranged. According to such a configuration, the transition points of the logic value of the odd data data1<0:3> and data3<0:3> applied to the odd data pad group 310 and 330 may be different from those of the even data data2<0:3> and data4<0:3> applied to the even data pad group 320 and 340. Accordingly, the crosstalk effect between the respective data pads may decrease.

The multi-phase clock signals 1clk1 to 1clk4, 2clk1 to 2clk4, and clk1 to clk4 having the first to third phases, respectively, may be configured to have four phases respectively. However, the number of phases owned by the multi-phase clock signals is only an example. The configuration in which the multi-phase clock signals 1clk1 to 1clk4, 2clk1 to 2clk4, and clk1 to clk4 having the first to third phases, respectively, are set to have four phases is only an example and does not limit the present invention.

Furthermore, as illustrated in FIG. 2, the odd data clock buffer group 210 and 230 and the even data clock buffer group 220 and 240, respectively, are configured to have two clock buffers. However, this is only an example. The odd data clock buffer group 210 and 230 and the even data clock buffer group 220 and 240, respectively, may include two or more clock buffers.

Figure 3:
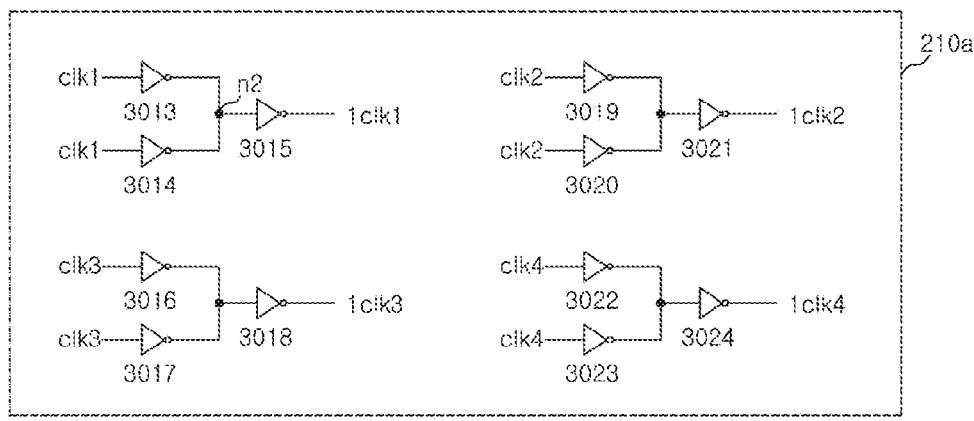
FIG. 3 is a circuit diagram of an odd data clock buffer group and an even data clock buffer group illustrated in FIG. 2, according to the exemplary embodiment.
Figure 3:
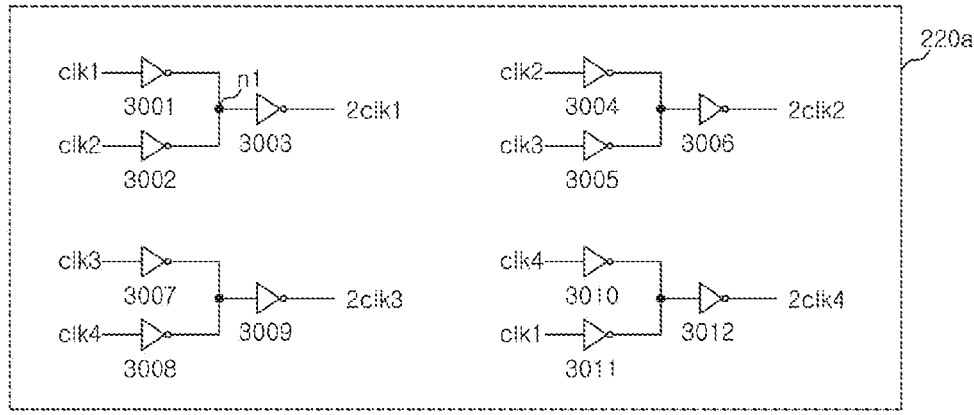

FIG. 3 is a circuit diagram of the odd data clock buffer group 210 and 230 and the even data clock buffer group 220 and 240 illustrated in FIG. 2, according to an exemplary embodiment.

FIG. 3 illustrates the odd data clock buffer 210a and the even data clock buffer 220a. The odd data clock buffer 230 and the even data clock buffer 240 may be configured in the same manner as the odd data clock buffer 210a and the even data clock buffer 220a.

As illustrated in FIG. 3, the odd data clock buffer 210a may include a plurality of inverters 3013 to 3024.

The inverter 3013 is configured to invert a clock signal clk1 of the third multi-phase clock signal.

The inverter 3014 is configured to invert the clock signal clk1 of the third multi-phase clock signal. The output signals of the inverters 3013 and 3014 are mixed at a second node n2.

The inverter 3015 is configured to invert and amplify the voltage of the second node n2, and output the inverted and amplified voltage as a clock signal 1clk1 of the first multi-phase clock signal.

Accordingly, the phase of the clock signal 1clk1 of the first multi-phase clock signal becomes the same phase as the clock signal clk1 of the third multi-phase clock signal.

The inverters 3016 to 3024 may be configured in the same manner as the inverters 3013 to 3015, except that input and output signals are different. Therefore, the detailed descriptions thereof are omitted.

The first multi-phase clock signal 1clk1 to 1clk4, which is generated according to the operation of the odd data clock buffer 210a configured as illustrated in FIG. 3, has the same phases as those of the third multi-phase clock signal clk1 to clk4, respectively.

For example, when it is assumed that the phases of the third multi-phase clock signal clk1 to clk4 are 0, 90, 180, and 270 degrees, respectively, the phases of the first multi-phase clock signal 1clk1 to 1clk4 may become 0, 90, 180, and 270 degrees, respectively, but they are not limited thereto.

As illustrated in FIG. 3, the even data clock buffer 220a may include an interpolation circuit configured to interpolate the third multi-phase clock signal clk1 to clk4 and generate the second multi-phase clock signal 2clk1 to 2clk4.

The even data clock buffer 220a may include a plurality of inverters 3001 to 3012.

The inverter 3001 is configured to invert a clock signal clk1 of the third multi-phase clock signal.

The inverter 3002 is configured to invert a clock signal clk2 of the third multi-phase clock signal. The output signals of the inverters 3001 and 3002 are mixed at a first node n1.

Accordingly, the inverter 3003 is configured to invert and amplify the voltage of the first node n1, and output the inverted and amplified voltage as a clock signal 2clk1 of the second multi-phase clock signal.

Accordingly, the phase of the clock signal 2clk1 of the second multi-phase clock signal becomes a phase between the phases of two clock signals clk1 and clk2 of the third multi-phase clock signal.

The inverters 3004 to 3012 may be configured in the same manner as the inverters 3001 to 3003, except that input and output signals are different. Therefore, the detailed descriptions thereof are omitted.

The phases of the second multi-phase clock signal 2clk1 to 2clk4, which is generated according to the operation of the odd data clock buffer 220a configured as illustrated in FIG. 3, become the phases between the phases of respective two clock signals of the third multi-phase clock signal clk1 to clk4.

For example, when it is assumed that the phases of the third multi-phase clock signal clk1 to clk4 are 0, 90, 180, and 270 degrees, respectively, the phases of the second multi-phase clock signal 2clk1 to 2clk4 may become 45, 135, 225, and 315 degrees, respectively, but they are not limited thereto.

When it is exemplified that the phases of the first multi-phase clock signal clk1 to clk4 are 0, 90, 180, and 270 degrees, respectively, and the phases of the second multi-phase clock signal 2clk1 to 2clk4 are 45, 135, 225, and 315 degrees, respectively, the odd data output buffer group 110 and 130 and the even data output buffer group 120 and 140 alternately output data to the odd data pad group 310 and 330 and the even data pad group 320 and 340, respectively, at an interval of 45 degrees.

At the time points where the logic values of the odd data data1<0:3> and data3<0:3> applied to the odd data pad group 310 and 330 transit (that is, at the phases of 0, 90, 180, and 270 degrees), the even data data2<0:3> and data4<0:3> applied to the even data pad group 320 and 340 maintain their logic values.

On the other hand, at the time points where the logic values of the even data data2<0:3> and data4<0:3> applied to the even data pad group 320 and 340 transit (that is, at the phases of 45, 135, 225, and 315 degrees), the odd data data1<0:3> and data3<0:3> applied to the odd data pad group 310 and 330 maintain their logic values.

Figure 4:
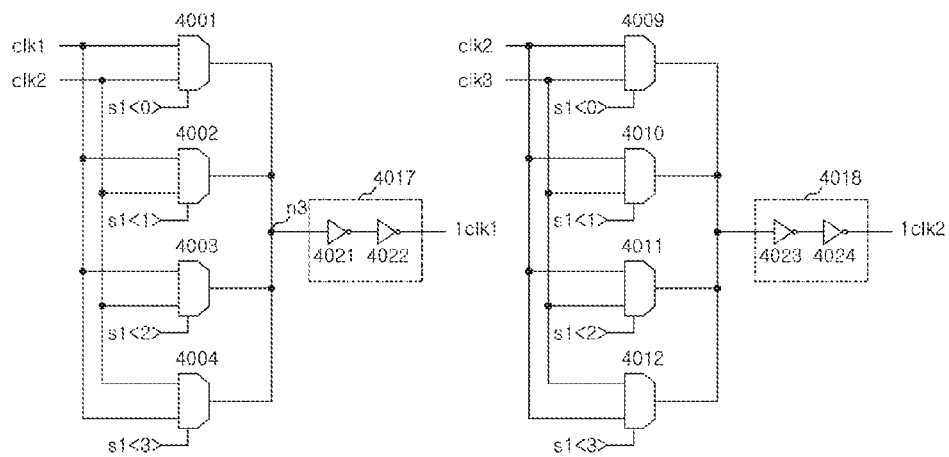
FIG. 4 is a circuit diagram of an odd data clock buffer group and an even data clock buffer group illustrated in FIG. 2, according to another exemplary embodiment.
Figure 4:
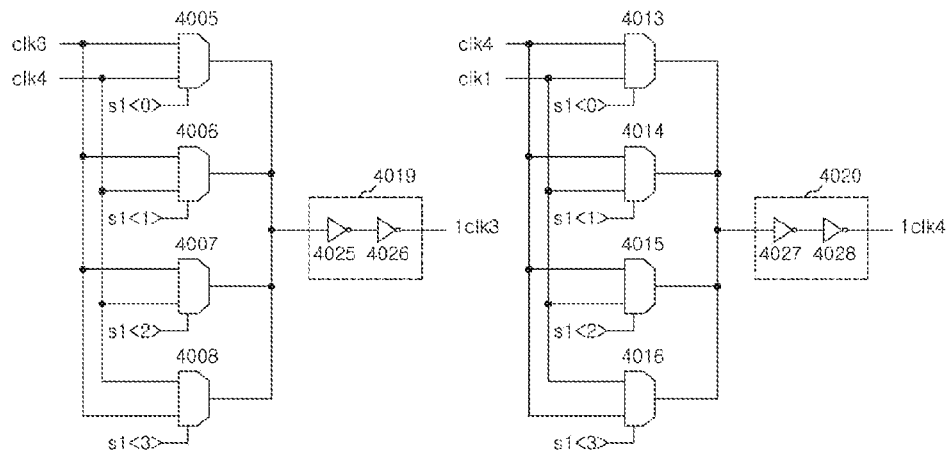

FIG. 4 is a circuit diagram of the odd data clock buffer group 210 and 230 and the even data clock buffer group 220 and 240 illustrated in FIG. 2, according to another exemplary embodiment.

FIG. 4 illustrates the odd data clock buffer 210b.

The even data clock buffer 220, the odd data clock buffer 230, and the even data clock buffer 240 may be configured in the same manner as the odd data clock buffer 210b and the even data clock buffer (not shown), except for the input and output relation.

The odd data clock buffer 210b illustrated in FIG. 4 is configured to control the phases of the first multi-phase clock signal 1clk1 to 1clk4 according to a control signal s1<0:3>.

Referring to FIG. 4, the odd data clock buffer 210b is configured to interpolate the third multi-phase clock signal clk1 to clk4, and output the first multi-phase clock signal 1clk1 to 1clk4. More specifically, the odd data clock buffer 210b controls the phases of the first multi-phase clock signal 1clk1 to 1clk4 by changing the interpolation degree depending on the control signal s1<0:3>.

The control signal s1<0:3> may be configured by using a mode resister set (MRS, not shown) or configured by using a test mode signal.

The odd data clock buffer 210b may include first to sixteenth selection sections 4001 to 4016 and first to fourth output sections 4017 to 4020.

The first to fourth selection sections 4001 to 4004 are configured to receive two clock signals clk1 and clk2 of the third multi-phase clock signal clk1 to ckl4. Furthermore, the first to fourth selection sections 4001 to 4004 select and output one of the two phase clock signals clk1 and clk2 according to the respective bits of the control signal s1<0:3>. The output signals of the first to fourth selection sections 4001 to 4004 are mixed at a third node n3. The first to fourth selection sections 4001 to 4004 may include multiplexer circuits.

The first output section 4017 may include inverters 4021 and 4022.

The inverter 4021 is configured to invert and amplify the voltage of the third node n3.

The inverter 4022 is configured to invert and amplify an output signal of the inverter 4021, and output the inverted and amplified signal as a clock signal 1clk1 of the first multi-phase clock signal 1clk1 to 1clk4.

The fifth to sixteenth selection sections 4005 to 4016 and the second to fourth output sections 4018 to 4020 may be configured in the same manner as the first to fourth selection sections 4001 to 4004 and the first output section 4017, respectively, except for the input and output relations. Therefore, the detailed descriptions thereof are omitted herein.

The odd data clock buffer 210b configured as illustrated in FIG. 4 interpolates the third multi-phase clock signal clk1 to clk4, and generates the first multi-phase clock signal 1clk1 to 1clk4, and the interpolation degree thereof changes depending on the control signal s1<0:3>.

For example, when every bit of the control signal s1<0:3> is zero, the first to fourth selection sections 4001 to 4004 of the odd data clock buffer 210b output the clock signal clk1. Accordingly, the clock signal 1clk1 has the same phase as that of the clock signal clk1.

For another example, when two bits s1<0:1> of the control signal s1<0:3> are zero and the other two bits s1<2:3> are one, the first and second selection sections 4001 and 4002 of the odd data clock buffer 210b output the clock signal clk1, and the third and fourth selection sections 4003 and 4004 output the clock signal clk2. Accordingly, the phase clock signal 1clk1 has a phase between the phase clock signal clk1 and the phase clock signal clk2.

The odd data clock buffer 210b may differently control the phase of the first multi-phase clock signal 1clk1 to 1clk4 depending on the control signal s1<0:3>. Also, the odd data clock buffer 210b may differently control the phase depending on driving capabilities of the first to sixteenth selection sections 4001 to 4016.

Furthermore, the phase of the first multi-phase clock signal 1clk1 to 1clk4 may be more precisely controlled by increasing the number of selection sections and the bit number of the control signal s1<0:3> for controlling the selection sections. The odd data clock buffer 210b illustrated in FIG. 4 comprise four sets of four selection sections and the bit number of the control signal s1<0:3> is four, but it does not limit the present invention.

The even data clock buffer (not shown) may be configured in a similar manner to the odd data clock buffer 210b illustrated in FIG. 4. The even data clock buffer may be configured to receive a different control signal instead of the control signal s1<0:3> of the odd data clock buffer 210b illustrated in FIG. 4.

The odd data clock buffer 210b may be configured to generate the first multi-phase clock signal 1clk1 to 1clk4 in response to the control signal s1<0:3>, and the even data clock buffer may be configured to generate the second multi-phase clock signal in response to the different control signal.

The even data clock buffer may be configured in the same manner as the odd data clock buffer 210b illustrated in FIG. 4, except for the input and output relation. Therefore, the detailed descriptions thereof are omitted herein.

In theory, when the multi-phase clock signal has four phases as described above, a difference between the phase of the first multi-phase clock signal 1clk1 to 1clk4 and the phase of the second multi-phase clock signal 2clk1 to 2clk4 may be set to 45 degrees. This is because the four phases have an interval of 90 degrees therebetween.

However, the difference between the phase of the first multi-phase clock signal 1clk1 to 1clk4 and the phase of the second multi-phase clock signal 2clk1 to 2clk4 may be set to a different value instead of 45 degrees according to the electric and magnetic fields around the even and odd data pad groups 310 to 340 after the semiconductor system is actually configured. As a result, a crosstalk effect between the even and odd transmission line groups t11 to t14 and between the channels cnl1 to cnl4 including the even and odd data pad groups 310 to 340 may decrease.

The even and odd data clock buffer groups 210 to 240 based on FIGS. 2 and 4 may control the first and second phases according to the control signals s1<0:3> and s2<0:3>. Therefore, the semiconductor system according to the embodiment is suitable for being configured to control the difference between the first and second phases.

Furthermore, when the multi-phase clock signal has four phases, the difference between the phases of the first multi-phase clock and the multi-phase clock may be theoretically set to 45 degrees. However, a phase difference may differ depending on the number of phases included in the multi-phase clock signal. For example, if the multi-phase clock signal has eight phases, the difference of phase between the first and second multi-phase clock may be theoretically set to 22.5 degrees. That is, if a multi-phase clock signal has phases corresponding to 2n (n is an integer equal to or larger than 1), the difference of phase between the first and second multi-phase clock may be theoretically set to 360/4n degrees.

While certain embodiments have been described above, it will be understood to those skilled in the art that the embodiments described are by way of example only. Accordingly, the semiconductor system and the semiconductor apparatus described herein should not be limited based on the described embodiments. Rather, the semiconductor system and the semiconductor apparatus described herein should only be limited in light of the claims that follow when taken in conjunction with the above description and accompanying drawings.

What is claimed is:

1. A semiconductor apparatus comprising:
    an odd data clock buffer group configured to buffer a phase of a multi-phase source clock signal, and output a first multi-phase clock signal;
    an even data clock buffer group configured to buffer the phase of the multi-phase source clock signal, and output a second multi-phase clock signal;
    an odd data output buffer group configured to drive odd data in response to the first multi-phase clock signal, and output the driven data to an odd data pad group; and
    an even data output buffer group configured to drive even data in response to the second multi-phase clock signal, and output the driven data to an even data pad group, wherein the phases of clock signals of the first and second multi-phase clock signal are different from each other, wherein each of the odd and even data clock buffer groups is configured to control an amount of a phase shift of the first and second multi-phase clock signal respectively, in response to a control signal, wherein each of the odd and even data clock buffer groups comprises: a first selection section configured to select one of the inputted multi-phase source clock signal in response to the control signal;

a second selection section configured to select one of the inputted multi-phase source clock signal in response to the control signal; and an output section configured to mix an output signal of the first selection section and an output signal of the second selection section, and output the mixed signal.

2. The semiconductor apparatus according to claim 1, wherein transmission lines coupling the odd data output buffer group to the odd data pad group and transmission lines coupling the even data output buffer group to the even data pad group are alternately arranged.

3. The semiconductor apparatus according to claim 1, wherein each of the odd and even data clock buffer group comprises an interpolation circuit configured to interpolate the multi-phase source clock signal and generate the first and second multi-phase clock signal respectively.

4. The semiconductor apparatus according to claim 1, wherein transition points of logic value of data applied to the even data output buffer group are different from those of data applied to the odd data output buffer group.

5. The semiconductor apparatus according to claim 1,
wherein the first and second multi-phase clock signals respectively have 2n phases, and
wherein the difference of phase between the first and second multi-phase clock is 360/4n degrees, where n is an integer equal to or larger than one.

6. A semiconductor apparatus comprising:
an odd data clock buffer configured to maintain or shift a phase of a source clock signal, and output a first clock signal;
an even data clock buffer configured to maintain or shift the phase of the source clock signal, and output a second clock signal;
an odd data output buffer configured to output data in response to the first clock signal; and
an even data output buffer configured to output data in response to the second clock signal, wherein the phases of the first clock signal and the second clock signal are different from each other,
wherein each of the odd and even data clock buffers is configured to control an amount of a phase shift of the first and second clock signal respectively, in response to a control signal,
wherein each of the odd and even data clock buffers comprises: a first selection section configured to select one of the inputted source clock signal in response to the control signal;
a second selection section configured to select one of the inputted source clock signal in response to the control signal; and an output section configured to mix an output signal of the first selection section and an output signal of the second selection section, and output the mixed signal.

7. A semiconductor system comprising:
a transmission unit; and a reception unit, wherein the transmission unit is configured to output odd data to an odd data pad group in response to a first multi-phase clock signal and output even data to an even data pad group in response to a second multi-phase clock signal, wherein the phases of clock signals of the first and second multi-phase clock signal are different from each other, wherein the transmission unit comprises: a multi-phase clock generation section configured to interpolate a multi-phase source clock and generate the first multi-phase clock signal and the second multi-phase clock signal;

an odd data output buffer group configured to output the odd data to the odd data pad group in synchronization with the first multi-phase clock signal; and an even data output buffer group configured to output the even data to the even data pad group in synchronization with the second multi-phase clock signal, wherein the multi-phase clock generation section is configured to control one or more of the phases of the first multi-phase clock signal and the second multi-phase clock signal in response to a control signal, wherein the multi-phase clock generation section comprises:

a first selection section configured to select one of the inputted multi-phase source clock signal in response to the control signal;

a second selection section configured to select one of the inputted multi-phase source clock signal in response to the control signal; and an output section configured to mix an output signal of the first selection section and an output signal of the second selection section, and output the mixed signal.

8. The semiconductor system according to claim 7, wherein transition points of logic value of data applied to the even data pad group are different from those of data applied to the odd data pad group.

9. The semiconductor system according to claim 7, wherein the first and second multi-phase clock signals respectively have 2n phases, and
wherein the difference of phase between the first and second multi-phase clock is 360/4n degrees, where n is an integer equal to or larger than one.

10. The semiconductor system according to claim 7, wherein transmission lines coupling the odd data output buffer group to the odd data pad group and transmission lines coupling the even data output buffer group to the even data pad group are alternately arranged.

11. The semiconductor system according to claim 7, wherein the transmission unit is arranged in a semiconductor memory apparatus, and the reception unit is arranged in a controller for controlling the semiconductor memory apparatus.

12. The semiconductor system according to claim 7, wherein the reception unit is arranged in a semiconductor memory apparatus, and the transmission unit is arranged in a controller for controlling the semiconductor memory apparatus.

* * * * *